(12) United States Patent
Okawa (10) Patent No.: US 9,559,197 B2
(45) Date of Patent: Jan. 31, 2017

(54) HETERO-JUNCTION SEMICONDUCTOR DEVICE AND METHOD OF MANUFACTURING A HETERO-JUNCTION SEMICONDUCTOR DEVICE

(71) Applicant: TOYOTA JIDOSHA KABUSHIKI KAISHA, Toyota-shi, Aichi-ken (JP)

(72) Inventor: Takashi Okawa, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/138,808

(22) Filed: Apr. 26, 2016

(65) Prior Publication Data

US 2016/0343841 A1 Nov. 24, 2016

(30) Foreign Application Priority Data

May 18, 2015 (JP) ................. 2015-101118

(51) Int. Cl.
| | | |
|---|---|---|
| H01L 29/15 | (2006.01) | |
| H01L 29/778 | (2006.01) | |
| H01L 29/205 | (2006.01) | |
| H01L 29/20 | (2006.01) | |
| H01L 29/06 | (2006.01) | |
| H01L 29/66 | (2006.01) | |

(52) U.S. Cl.
CPC ....... *H01L 29/7787* (2013.01); *H01L 29/0688* (2013.01); *H01L 29/2003* (2013.01); *H01L 29/205* (2013.01); *H01L 29/66462* (2013.01)

(58) Field of Classification Search
CPC .. H01L 31/1075; H01L 31/072; H01L 29/737; H01L 21/2015
See application file for complete search history.

(56) References Cited

U.S. PATENT DOCUMENTS

2013/0082276 A1   4/2013   Park et al.

FOREIGN PATENT DOCUMENTS

| JP | 2009-043924 A | 2/2009 |
| JP | 2013-080894 A | 5/2013 |

*Primary Examiner* — Elias M Ullah
(74) *Attorney, Agent, or Firm* — Oliff PLC

(57) ABSTRACT

A hetero-junction semiconductor device includes: a channel layer that includes a first semiconductor; a barrier layer that is provided on the channel layer and includes a semiconductor having a band gap larger than a band gap of the first semiconductor; a source electrode and a drain electrode that are provided on the barrier layer and are ohmic contacted to the barrier layer; a p-type semiconductor layer provided on the barrier layer, the p-type semiconductor layer being provided in a region between the source electrode and the drain electrode on the barrier layer; an n-type semiconductor layer that is provided on the p-type semiconductor layer; and a gate electrode that is joined to the n-type semiconductor layer. A joint interface between the p-type semiconductor layer and the n-type semiconductor layer has a concavo-convex structure.

6 Claims, 7 Drawing Sheets

HETERO-JUNCTION SEMICONDUCTOR DEVICE AND METHOD OF MANUFACTURING A HETERO-JUNCTION SEMICONDUCTOR DEVICE

INCORPORATION BY REFERENCE

The disclosure of Japanese Patent Application No. 2015-101118 filed on May 18, 2015 including the specification, drawings and abstract is incorporated herein by reference in its entirety.

BACKGROUND OF THE INVENTION

1. Field of the Invention

The present invention relates to a hetero-junction semiconductor device and a method of manufacturing a hetero-junction semiconductor device.

2. Description of Related Art

Disclosed is a nitride semiconductor device which is a hetero-junction semiconductor element device in which a channel layer formed of gallium nitride (GaN) and a barrier layer formed of aluminum gallium nitride (AlGaN) are joined to each other. In this nitride semiconductor device, a p-type GaN layer, an n-type GaN layer, and a gate electrode are laminated on the barrier layer (Japanese Patent Application Publication No. 2013-80894 (JP 2013-80894 A)).

In the nitride semiconductor device according to the above-described related art, the dopant concentration in the p-type GaN layer may be set to be high such that the device is made to be in an off state (normally-off state) in a state where a voltage is not applied to the gate electrode. In addition, the dopant concentration in the n-type GaN layer may be set to be high such that contact resistance with the gate electrode is reduced.

SUMMARY OF THE INVENTION

In a case where the p-type GaN layer having a high dopant concentration and the n-type GaN layer having a high dopant concentration are joined to each other, a depletion layer formed at an interface between the p-type GaN layer and the n-type GaN layer is narrowed. As a result, a leakage current flowing from the gate electrode to a source electrode may increase.

According to a first aspect of the invention, a hetero-junction semiconductor device includes: a channel layer that includes a first semiconductor; a barrier layer that is provided on the channel layer and includes a semiconductor having a band gap larger than a band gap of the first semiconductor; a source electrode and a drain electrode that are provided on the barrier layer and are ohmic contacted to the barrier layer; a p-type semiconductor layer provided on the barrier layer, the p-type semiconductor layer being provided in a region between the source electrode and the drain electrode on the barrier layer; an n-type semiconductor layer that is provided on the p-type semiconductor layer; and a gate electrode that is joined to the n-type semiconductor layer. A joint interface between the p-type semiconductor layer and the n-type semiconductor layer has a concavo-convex structure.

In the first aspect, the p-type semiconductor layer and the gate electrode may be joined to each other through an insulating layer, in a convex region of the p-type semiconductor layer of the concavo-convex structure.

In the first aspect, the gate electrode may be provided on a top surface of the n-type semiconductor layer and a side surface of the n-type semiconductor layer.

In the first aspect, a corner of the concavo-convex structure may have a curved surface.

In the first aspect, the channel layer may be composed of GaN. The barrier layer may be composed of AlGaN. The p-type semiconductor layer may be composed of p-type GaN. The n-type semiconductor layer may be composed of n-type GaN.

In the first aspect, a width of a groove in the concavo-convex structure may be set such that a depletion layer spreads over an entire convex region of the p-type semiconductor layer and an entire convex region of the n-type semiconductor layer.

A second aspect of the invention provides a method of manufacturing a hetero-junction semiconductor device. The second aspect includes: a) forming a barrier layer on a channel layer, the channel layer including a first semiconductor, the barrier layer including a semiconductor having a band gap larger than a band gap of the first semiconductor; b) forming a source electrode and a drain electrode which are ohmic contacted to the barrier layer, the source electrode and the drain electrode being formed on the barrier layer; c) forming a p-type semiconductor layer on the barrier layer, the p-type semiconductor layer being provided between the source electrode and the drain electrode; d) processing a surface of the p-type semiconductor layer to form a concavo-convex structure, the surface of the p-type semiconductor layer being opposite to a surface of the p-type semiconductor layer facing the barrier layer; e) forming an n-type semiconductor layer on the p-type semiconductor layer, a joint interface of the n-type semiconductor layer with the p-type semiconductor layer having a concavo-convex structure; and f) forming a gate electrode on the n-type semiconductor layer.

The second aspect may include g) forming an insulating layer on the p-type semiconductor layer, during a period between the step c) and the step d).

In the second aspect, the above step d) includes processing the insulating layer and the p-type semiconductor layer such that the insulating layer and the p-type semiconductor layer form a concavo-convex structure, and the insulating layer covers a tip of a convex region of the concavo-convex portion.

In the second aspect, the above step f) may include forming the gate electrode on a top surface and a side surface of the n-type semiconductor layer.

In the second aspect, the above step d) may include processing a corner of the concavo-convex structure to have a curved surface.

In the second aspect, a groove in the concavo-convex structure may be processed to have a width in which a depletion layer spreads over an entire convex region of the p-type semiconductor layer and an entire convex region of the n-type semiconductor layer, in the above step d).

According to the first and second aspects, a hetero-junction semiconductor device having normally-off characteristics and a reduced leakage current of a gate can be provided.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

First Embodiment

Figure 1:
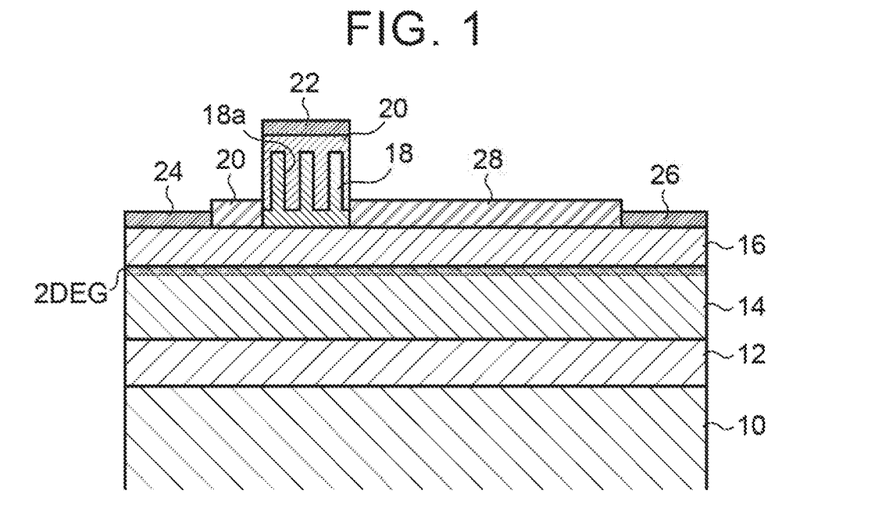
FIG. 1 is a sectional view schematically showing a configuration of a hetero-junction semiconductor device according to a first embodiment.

As shown in FIG. 1, a hetero-junction semiconductor device according to a first embodiment includes a substrate 10, a buffer layer 12, a channel layer 14, a barrier layer 16, a p-type semiconductor layer 18, an n-type semiconductor layer 20, a gate electrode 22, a source electrode 24, a drain electrode 26, and a protective film 28.

The channel layer 14 is a semiconductor layer which forms a hetero-junction at an interface with the barrier layer 16 described below. The channel layer 14 is formed of a semiconductor material having high lattice matching with the barrier layer 16. The thickness of the channel layer 14 is not particularly limited and is preferably about several hundreds of nanometers.

The channel layer 14 is formed on the substrate 10. The substrate 10 is formed of a material having a lattice constant and a thermal expansion coefficient which are similar to those of the channel layer 14, for example, silicon carbide, sapphire, aluminum nitride, aluminum gallium nitride, gallium nitride, or silicon. In addition, optionally, the buffer layer 12 may be formed between the substrate 10 and the channel layer 14. The buffer layer 12 is provided to relax lattice mismatching between the substrate 10 and the channel layer 14. It is preferable that the buffer layer 12 is formed of a material having an intermediate lattice constant between a lattice constant of the substrate 10 and a lattice constant of the channel layer 14. The buffer layer 12 may be formed as a single layer or a composite layer which is formed of for example, gallium nitride (GaN), aluminum gallium nitride (AlGaN), aluminum nitride (AlN), indium gallium nitride (InGaN), or indium aluminum gallium nitride (InAlGaN).

The barrier layer 16 is a semiconductor layer which is laminated on the channel layer 14 and forms a hetero-junction at an interface with the channel layer 14. The barrier layer 16 is formed of a semiconductor material having a band gap larger than a band gap of the channel layer 14 and having high lattice matching with the channel layer 14. As a result, spontaneous polarization or piezoelectric polarization occurs at an interface between the channel layer 14 and the barrier layer 16. Due to this polarization effect, two-dimensional electron gas (2DEG) having a high carrier (electron) density is produced at the interface between the channel layer 14 and the barrier layer 16.

In addition, two-dimensional electron gas (2DEG) may be produced by adding a dopant to the interface region between the channel layer 14 and the barrier layer 16 to δ-dope the interface region. For example, in a case where the barrier layer 16 is formed of AlGaN, at least one of silicon (Si), germanium (Ge), and oxygen (O) may be used as an n-type dopant for δ-doping.

A combination of the channel layer 14 and the barrier layer 16 is not particularly limited as long as a heterointerface having high crystallinity is formed. For example, a Group III-V semiconductor compound which contains one or more Group III elements and one or more Group V elements, a Group II-VI semiconductor compound which contains one or more Group II elements and one or more Group VI elements, and a Group IV semiconductor which contains a Group IV element may be appropriately selected and combined with each other. Examples of the combination of the barrier layer 16 and the channel layer 14 include AlGaN/GaN, AlGaAs/GaAs, AlN/GaN, InAlN/GaN, AlGaNP/GaNP, InAlGaAsP/InGaP, AlN/InN, and GaP/Si. For example, the channel layer 14 may be formed of i-type GaN, and the barrier layer 16 may be formed of i-type $Al_xGa_{1-x}N$. A stoichiometric composition ratio x of Al and Ga of the barrier layer 16 is not particularly limited. For example, in a high-power hetero-junction semiconductor device, it is preferable that an average composition ratio x of the entire barrier layer 16 is 0.1 to 0.3.

The p-type semiconductor layer 18 is provided on the barrier layer 16, in a region between the source electrode 24 and the drain electrode 26. The p-type semiconductor layer 18 is a semiconductor layer to which a p-type dopant is added. The thickness of the p-type semiconductor layer 18 is not particularly limited but is preferably 50 nm to 300 nm (for example, 150 nm).

For example, in a case where the p-type semiconductor layer 18 is formed of a Group III-V semiconductor compound, and examples of the Group III-V semiconductor compound include a material obtained by adding a p-type dopant to gallium nitride (GaN), aluminum gallium nitride (AlGaN), aluminum nitride (AlN), indium gallium nitride (InGaN), indium aluminum gallium nitride (InAlGaN), or the like. Examples of the p-type dopant include magnesium (Mg). It is preferable that the dopant concentration in the p-type semiconductor layer 18 is higher than the dopant concentration in the channel layer 14.

In the hetero-junction semiconductor device according to the embodiment, the p-type semiconductor layer 18 has a trench structure (concavo-convex structure) where a groove 18a is formed in a depth direction. The width of the groove 18a is not particularly limited but is preferably 0.1 μm to 1 μm (for example, 0.5 μm). It is preferable that the depth of the groove 18a is set according to the thickness of the p-type semiconductor layer 18. The depth of the groove 18a is not particularly limited but is preferably 50 nm to 250 nm (for example, 100 nm).

The width of the groove 18a may be set such that a depletion layer 30 spreads over the entire convex region of the p-type semiconductor layer 18 and the entire convex region of the n-type semiconductor layer 20. The width is determined in consideration of the semiconductor materials used, the dopant concentrations in the semiconductor material, and the depth of the trench. When the depletion layer 30 spreads over the entire convex region of the p-type semiconductor layer 18 and the entire convex region of the n-type semiconductor layer 20, the area of the depletion layer 30 corresponding to at least the depth of the groove 18a in the concavo-convex structure can be secured.

The n-type semiconductor layer 20 is formed on the p-type semiconductor layer 18. In the hetero-junction semiconductor device according to the embodiment, the n-type semiconductor layer 20 is embedded into the groove 18a provided in the p-type semiconductor layer 18. That is, a joint interface between the p-type semiconductor layer 18 and the n-type semiconductor layer 20 has a concavo-convex structure. More specifically, at the joint interface between the p-type semiconductor layer 18 and the n-type semiconductor layer 20, a concave portion (groove 18a) of the p-type semiconductor layer 18 is embedded with a convex portion of the n-type semiconductor layer 20, and a concave portion of the n-type semiconductor layer 20 is embedded with a convex portion of the p-type semiconductor layer 18. The sum of the thickness of the n-type semiconductor layer 20 and the thickness of the p-type semiconductor layer 18 is preferably 50 nm to 300 nm (for example, 150 nm).

For example, in a case where the n-type semiconductor layer 20 is formed of a Group III-V semiconductor compound, and examples of the Group III-V semiconductor compound include a material obtained by adding a p-type dopant to gallium nitride (GaN), aluminum gallium nitride (AlGaN), aluminum nitride (AlN), indium gallium nitride (InGaN), indium aluminum gallium nitride (InAlGaN), or the like. Examples of the n-type dopant include selenium (Se), silicon (Si), germanium (Ge), and oxygen (O). It is preferable that the dopant concentration in the n-type semiconductor layer 20 is higher than the dopant concentration in the channel layer 14.

The gate electrode 22 is formed on the n-type semiconductor layer 20. It is preferable that the gate electrode 22 is formed of metal, a metal silicide, and an alloy thereof. For example, although not limited thereto, it is preferable that the gate electrode 22 contains at least one selected from the group consisting of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn). The gate electrode 22 can be formed on the n-type semiconductor layer 20 by sputtering, vapor deposition, or the like using a well-known mask technique such as photolithography.

The source electrode 24 and the drain electrode 26 are electrodes for applying a current to the hetero-junction semiconductor device. The source electrode 24 and the drain electrode 26 are provided on the barrier layer 16 so as to form an ohmic junction with the barrier layer 16. It is preferable that the source electrode 24 and the drain electrode 26 are formed of metal, a metal silicide, and an alloy thereof. For example, although not limited thereto, it is preferable that the source electrode 24 and the drain electrode 26 contain at least one selected from the group consisting of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn). For example, the source electrode 24 and the drain electrode 26 may have a laminate structure of titanium (Ti)/aluminum (Al)/nickel (Ni) or a laminate structure of titanium (Ti)/aluminum-copper (AlCu). In a case where the barrier layer 16 is formed of another semiconductor material, the source electrode 24 and the drain electrode 26 may be formed of a material selected from materials which can form an ohmic junction with the semiconductor material. The source electrode 24 and the drain electrode 26 can be formed on appropriate regions on the barrier layer 16 by sputtering, vapor deposition, or the like using a well-known mask technique such as photolithography.

The protective film 28 is provided to protect a surface of the barrier layer 16. The protective film 28 is provided in a region of the surface of the barrier layer 16 where the gate electrode 22, the source electrode 24, and the drain electrode 26 are not provided. For example, in a case where the barrier layer 16 is formed of AlGaN, the protective film 28 may be formed of a material selected from silicon oxide ($SiO_2$), silicon nitride (SiN), alumina ($Al_2O_3$), and the like. In a case where the barrier layer 16 is formed of another semiconductor material, the protective film 28 may be formed of a material which is more chemically and mechanically stable than the barrier layer 16. By forming the protective film 28, the surface of the barrier layer 16 can be chemically and mechanically protected, and the interface state density at an interface with the barrier layer 16 can be reduced.

By applying a voltage between the source electrode 24 and the drain electrode 26 and applying a voltage to the gate electrode 22 in the hetero-junction semiconductor device according to the embodiment, a current flows between the source electrode 24 and the drain electrode 26. By changing the voltage applied to the gate electrode 22, the current flowing between the source electrode 24 and the drain electrode 26 can be controlled.

Here, by providing the p-type semiconductor layer 18 and the n-type semiconductor layer 20 below the gate electrode 22, a current can be controlled not to flow between the source electrode 24 and the drain electrode 26 in a state where a voltage is not applied to the gate electrode 22. That is, the hetero-junction semiconductor device according to the embodiment serves as a normally-off hetero-junction semiconductor device.

Figure 2A:
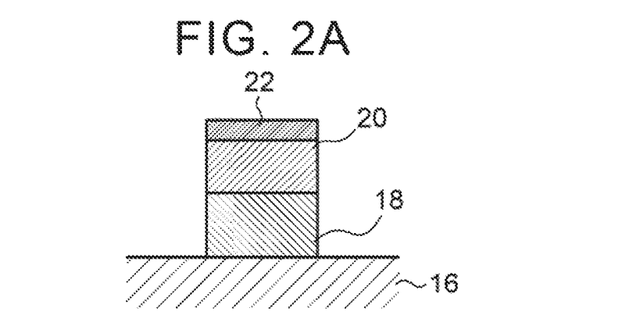
FIG. 2A is a diagram showing the spreading of a depletion layer on a gate of a hetero-junction semiconductor device in a case where a concavo-convex structure is not provided on a joint interface between a p-type semiconductor layer and an n-type semiconductor layer.
Figure 2B:
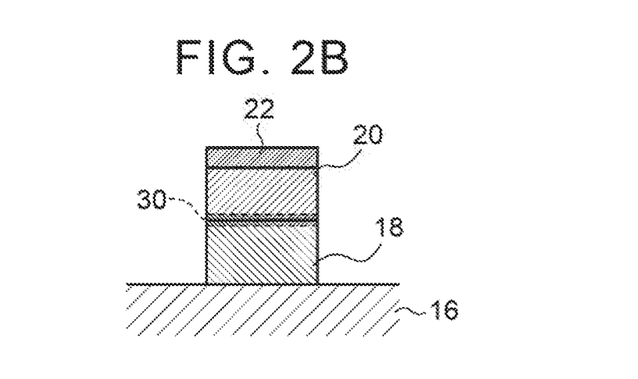
FIG. 2B is a diagram showing the spreading of the depletion layer on the gate of the hetero-junction semiconductor device in a case where the concavo-convex structure is not provided on the joint interface between the p-type semiconductor layer and the n-type semiconductor layer.
Figure 2C:
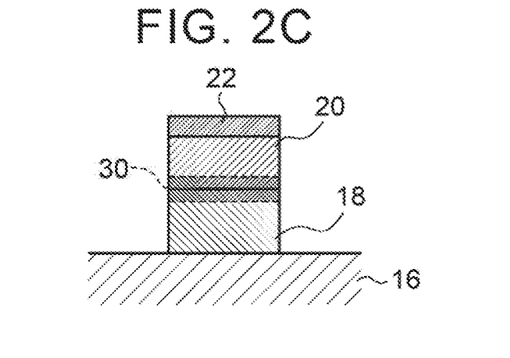
FIG. 2C is a diagram showing the spreading of the depletion layer on the gate of the hetero-junction semiconductor device in a case where the concavo-convex structure is not provided on the joint interface between the p-type semiconductor layer and the n-type semiconductor layer.

Here, as shown in FIG. 2A, in a case where it is assumed that the p-type semiconductor layer 18 does not have a trench structure, the spreading of the depletion layer at the interface between the p-type semiconductor layer 18 and the n-type semiconductor layer 20 during the application of a voltage to the gate electrode 22 will be discussed. As the voltage applied to the gate electrode 22 increases, the depletion layer 30 spreads at the interface between the p-type semiconductor layer 18 and the n-type semiconductor layer 20 as shown in FIGS. 2B and 2C. At this time, in a case where the dopant concentration in the p-type semiconductor layer 18 is set to be high in order to realize the normally-off state and where the dopant concentration in the n-type semiconductor layer 20 is set to be high in order to reduce contact resistance with the gate electrode 22, the width of the depletion layer 30 at the interface between the p-type semiconductor layer 18 and the n-type semiconductor layer 20 is narrowed, and the amount of a leakage current between the gate electrode 22 and the source electrode 24 increases.

Figure 3A:
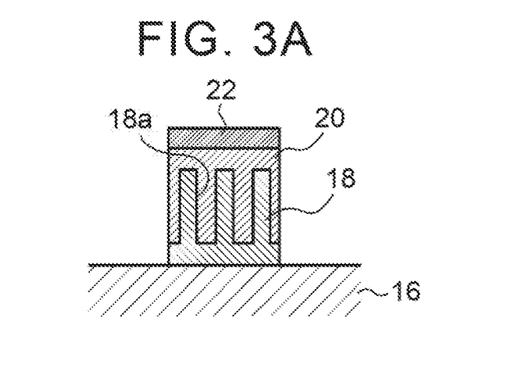
FIG. 3A is a diagram showing the spreading of a depletion layer on a gate of the hetero-junction semiconductor device according to the first embodiment.
Figure 3B:
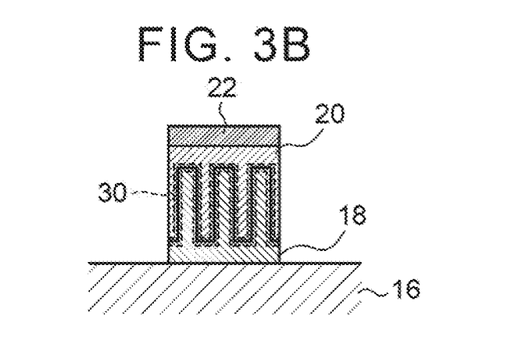
FIG. 3B is a diagram showing the spreading of the depletion layer on the gate of the hetero-junction semiconductor device according to the first embodiment.
Figure 3C:
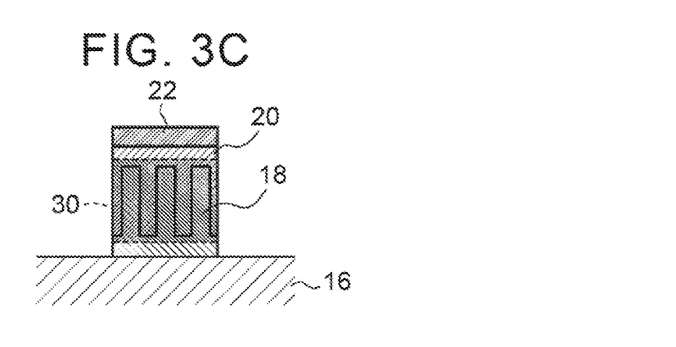
FIG. 3C is a diagram showing the spreading of the depletion layer on the gate of the hetero-junction semiconductor device according to the first embodiment.

Here, as shown in FIG. 3A, in a case where it is assumed that the p-type semiconductor layer 18 has a trench structure, the spreading of the depletion layer at the interface between the p-type semiconductor layer 18 and the n-type semiconductor layer 20 during the application of a voltage to the gate electrode 22 will be discussed. As the voltage applied to the gate electrode 22 increases, the depletion layer 30 spreads at the interface between the p-type semiconductor layer 18 and the n-type semiconductor layer 20 as shown in FIGS. 3B and 3C. At this time, even when the dopant concentrations in the p-type semiconductor layer 18 and the n-type semiconductor layer 20 are set to be high, the amount of a leakage current between the gate electrode 22 and the source electrode 24 can be reduced. The reason for this is that, since the junction area of the interface between the p-type semiconductor layer 18 and the n-type semiconductor layer 20 is large, the width of the depletion layer 30 is wider than that in the structure shown in FIGS. 2A to 2C where the concavo-convex structure is not provided.

(Manufacturing Method)

Hereinafter, a method of manufacturing the hetero-junction semiconductor device according to the first embodiment will be described with reference to FIGS. 4A to 4I.

Figure 4A:
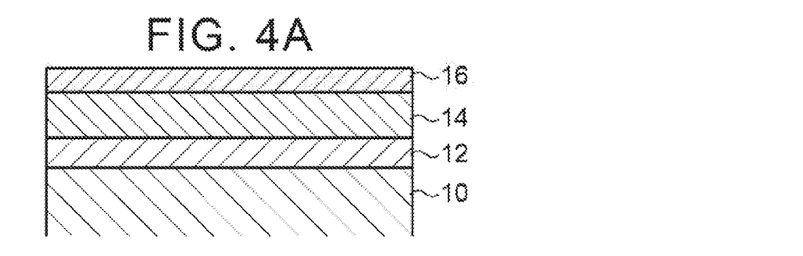
FIG. 4A is a diagram showing a method of manufacturing the hetero-junction semiconductor device according to the first embodiment.

In Step S10, as shown in FIG. 4A, the buffer layer 12, the channel layer 14, and the barrier layer 16 are formed on the substrate 10. The buffer layer 12, the channel layer 14, and the barrier layer 16 can be formed using a well-known method such as metal organic chemical vapor deposition (MOCVD) or molecular beam epitaxy (MBE). Raw materials (raw material gases) and film forming conditions used in MOCVD or MBE may be appropriately selected according to the semiconductor materials constituting the buffer layer 12, the channel layer 14, and the barrier layer 16.

For example, in order to form the channel layer 14 using GaN and to form the barrier layer 16 using AlGaN, the channel layer 14 and the barrier layer 16 can be formed through MOCVD using ammonia gas, trimethylaluminum (TMA), and trimethylgallium (TMG). In order to change the composition ratio x of the channel layer 14 and the barrier layer 16, a ratio of the supply flow rates of ammonia gas, TMA, and TMG may be appropriately changed such that the channel layer 14 and the barrier layer 16 have a desired composition ratio x in consideration of a relationship with the substrate temperature, the raw material supply pressure, and the film forming time. When the buffer layer 12, the channel layer 14, and the barrier layer 16 are formed of other semiconductor materials, a well-known film forming method may be used to form the layers.

Figure 4B:
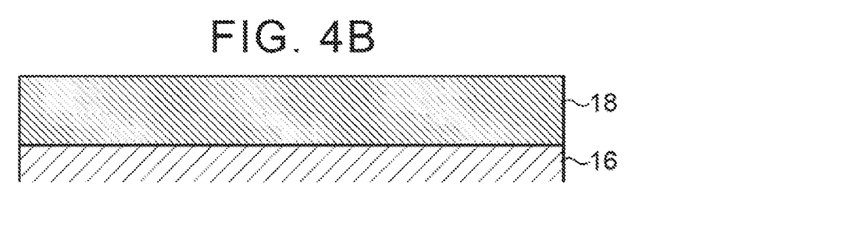
FIG. 4B is a diagram showing the method of manufacturing the hetero-junction semiconductor device according to the first embodiment.

In Step S12, as shown in FIG. 4B, the p-type semiconductor layer 18 is formed on the barrier layer 16. In the following description for the steps, the substrate 10, the buffer layer 12, and the channel layer 14 are not shown in the drawings. In order to form the p-type semiconductor layer 18 using GaN, the p-type semiconductor layer 18 can be formed through MOCVD by using ammonia gas and trimethylgallium (TMG) while adding magnesium (Mg) as a dopant. The p-type semiconductor layer 18 can be formed on the entire surface of the barrier layer 16.

Figure 4C:
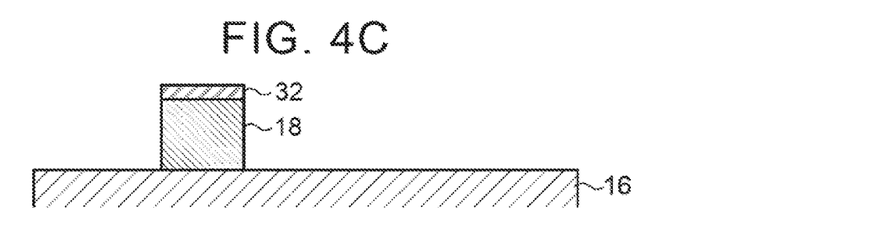
FIG. 4C is a diagram showing the method of manufacturing the hetero-junction semiconductor device according to the first embodiment.

In Step S14, as shown in FIG. 4C, the p-type semiconductor layer 18 is etched such that the p-type semiconductor layer 18 remains only in a gate region on the barrier layer 16. Using a photolithography technique, a resist 32 is formed only in a region for forming a gate, and the p-type semiconductor layer 18 is etched through the resist 32 as a mask. For the etching of the p-type semiconductor layer 18, either dry etching or wet etching may be used. For example, the p-type semiconductor layer 18 can be etched using reactive ion etching in which chlorine gas plasma is used. After completion of etching, the resist 32 is removed.

Figure 4D:
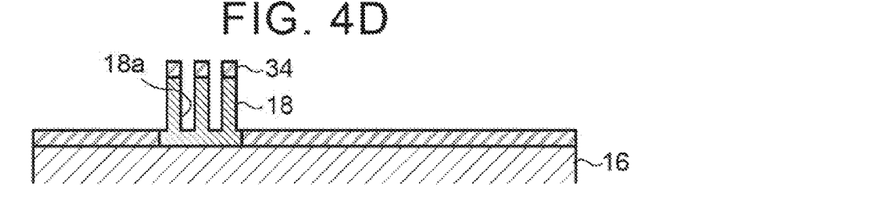
FIG. 4D is a diagram showing the method of manufacturing the hetero-junction semiconductor device according to the first embodiment.

In Step S16, as shown in FIG. 4D, the groove 18a of the concavo-convex structure, which is the trench, is formed on the p-type semiconductor layer 18. Using a photolithography technique, a resist 34 is formed in a region of the p-type semiconductor layer 18 excluding a region for forming the groove 18a, and the p-type semiconductor layer 18 is etched through the resist 34 as a mask. For the etching of the p-type semiconductor layer 18, as in the case of Step S14, either dry etching or wet etching may be used. After completion of etching, the resist 34 is removed.

Figure 4E:
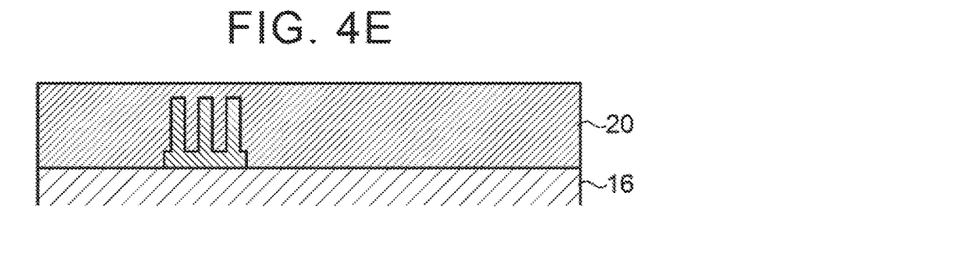
FIG. 4E is a diagram showing the method of manufacturing the hetero-junction semiconductor device according to the first embodiment.

In Step S18, as shown in FIG. 4E, the n-type semiconductor layer 20 is formed. In order to form the n-type semiconductor layer 20 using GaN, the n-type semiconductor layer 20 can be formed through MOCVD by using ammonia gas and trimethylgallium (TMG) while adding selenium (Se) as a dopant. The n-type semiconductor layer 20 can be formed on the entire surface of the barrier layer 16 and the p-type semiconductor layer 18. As a result, the n-type semiconductor layer 20 is embedded into the groove 18a of the trench structure formed on the p-type semiconductor layer 18.

Figure 4F:
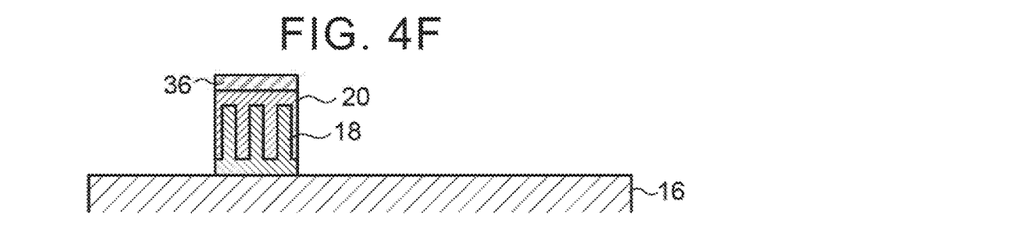
FIG. 4F is a diagram showing the method of manufacturing the hetero-junction semiconductor device according to the first embodiment.

In Step S20, as shown in FIG. 4F, the n-type semiconductor layer 20 is etched such that the n-type semiconductor layer 20 remains only in the gate region. Using a photolithography technique, a resist 36 is formed only in the gate region, and the n-type semiconductor layer 20 is etched through the resist 36 as a mask. For the etching of the n-type semiconductor layer 20, as in the case of Step S14, either dry etching or wet etching may be used. After completion of etching, the resist 36 is removed.

Figure 4G:
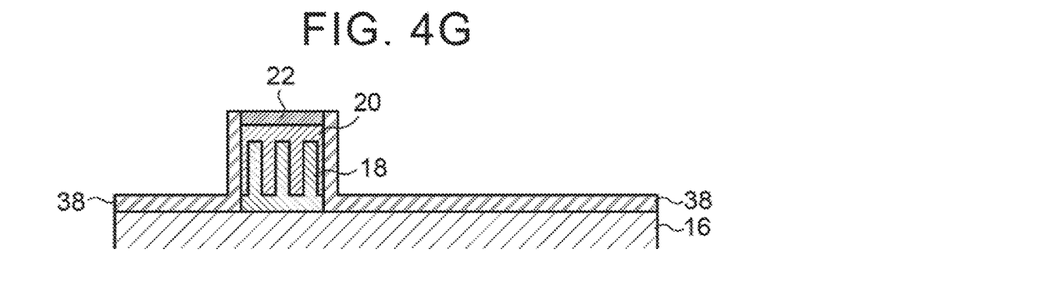
FIG. 4G is a diagram showing the method of manufacturing the hetero-junction semiconductor device according to the first embodiment.

In Step S22, as shown in FIG. 4G, the gate electrode 22 is formed. Using a photolithography technique, a resist 38 is formed in a region excluding the gate region, and the gate electrode 22 is etched through the resist 38 as a mask. The gate electrode 22 can be formed by sputtering or vacuum vapor deposition in which metal, a metal silicide, or an alloy thereof is used as a target or a vapor deposition source. After completion of the formation of the gate electrode 22, the resist 38 is removed.

Figure 4H:
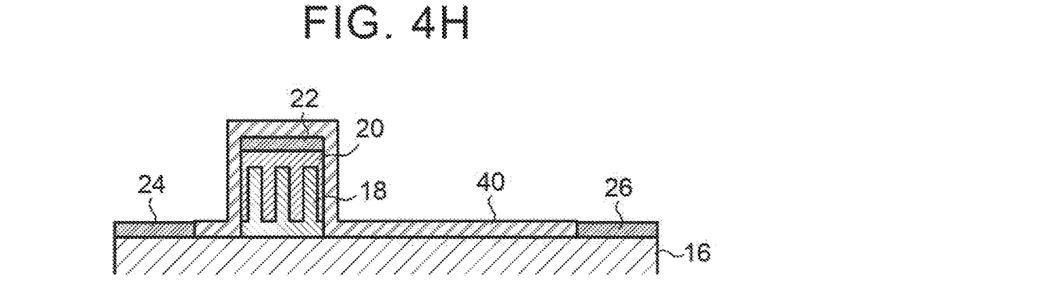
FIG. 4H is a diagram showing the method of manufacturing the hetero-junction semiconductor device according to the first embodiment.

In Step S24, as shown in FIG. 4H, the source electrode 24 and the drain electrode 26 are formed. Using a photolithography technique, a resist 40 is formed in a region excluding the region of the source electrode 24 and the drain electrode 26, and the source electrode 24 and the drain electrode 26 are formed through the resist 40 as a mask. The source electrode 24 and the drain electrode 26 can be formed by sputtering or vacuum vapor deposition in which metal, a metal silicide, or an alloy thereof is used as a target or a vapor deposition source. After completion of the formation of the source electrode 24 and the drain electrode 26, the resist 40 is removed.

Figure 4I:
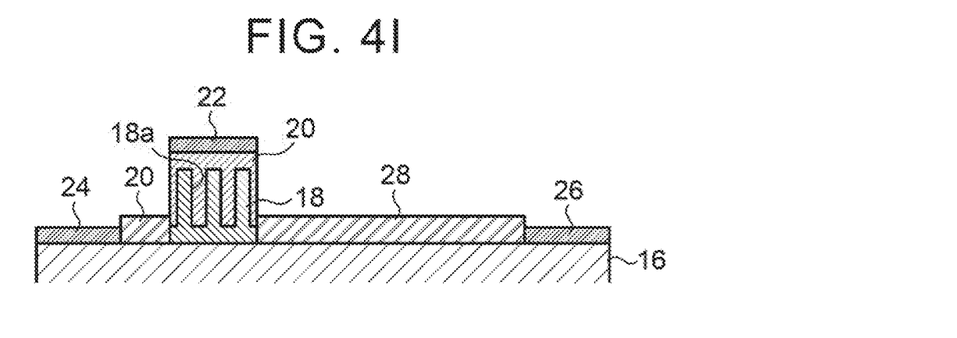
FIG. 4I is a diagram showing the method of manufacturing the hetero-junction semiconductor device according to the first embodiment.

In Step S26, as shown in FIG. 4I, the protective film 28 is formed in a region excluding the gate electrode 22, the source electrode 24, and the drain electrode 26. The protective film 28 can be formed by sputtering using a material such as silicon oxide ($SiO_2$), silicon nitride (SiN), or alumina ($Al_2O_3$).

Through the above-described steps, the hetero-junction semiconductor device according to the first embodiment can be manufactured.

Second Embodiment

Figure 5:
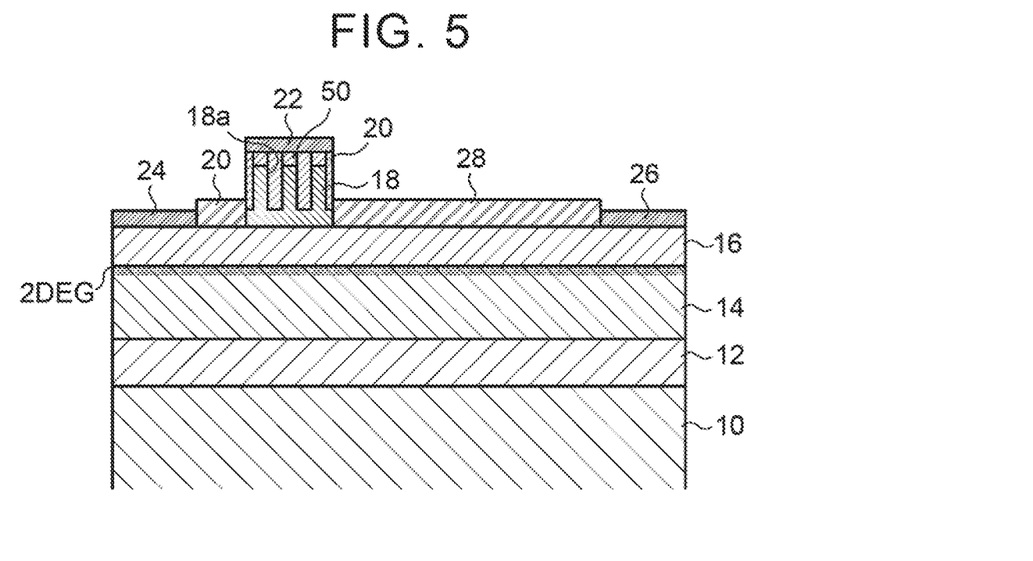
FIG. 5 is a sectional view schematically showing a configuration of a hetero-junction semiconductor device according to a second embodiment.

As shown in FIG. 5, a hetero-junction semiconductor device according to a second embodiment includes an insulating layer 50 that is formed on the p-type semiconductor layer 18 of the hetero-junction semiconductor device according to the first embodiment. Configurations other than the insulating layer 50 are the same as those of the hetero-junction semiconductor device according to the first embodiment. Therefore, the components are represented by the same reference numerals as in the first embodiment, and the description thereof will not be repeated.

The insulating layer 50 is provided between a tip end of the convex portion of the trench structure of the p-type semiconductor layer 18 and the gate electrode 22. The convex region has a shorter distance from the gate electrode 22 than the concave region and has a surface where the gate electrode 22 and the p-type semiconductor layer 18 face each other. In the convex region, for example, the distance between the gate electrode 22 and the p-type semiconductor layer 18 is 50 nm or less. Although not limited thereto, the insulating layer 50 may be formed of a material such as silicon oxide ($SiO_2$), silicon nitride (SiN), or alumina ($Al_2O_3$). The thickness of the insulating layer 50 is not particularly limited but is preferably 10 nm to 100 nm.

Figure 6:
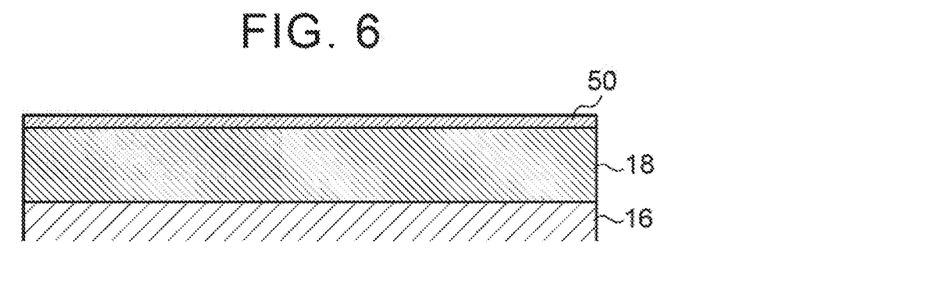
FIG. 6 is a diagram showing a method of manufacturing the hetero-junction semiconductor device according to the second embodiment.

As shown in FIG. 6, the insulating layer 50 can be formed only on the tip end portion of the trench structure of the p-type semiconductor layer 18 using a method including: providing Step S13 of forming the insulating layer 50 on the p-type semiconductor layer 18 during a period between Steps S12 and S14; and etching the insulating layer 50 using the same method as for the p-type semiconductor layer 18 in Steps S14 and S16.

In a hetero-junction semiconductor device of a technique of the related art, in a case where a high voltage of static electricity or the like is instantaneously applied to the gate electrode 22, the depletion layer may reach the gate electrode 22 after spreading between the gate electrode 22 and the tip end portion of the trench structure of the p-type semiconductor layer 18, in other words, the surface where the gate electrode 22 and the p-type semiconductor layer 18 face each other in the convex region of the p-type semiconductor layer 18. In such a case, a high current may flow through the gate portion and destructs the device. In the hetero-junction semiconductor device according to the second embodiment, the insulating layer 50 is provided between the gate electrode 22 and the tip end portion of the trench structure of the p-type semiconductor layer 18. Therefore, in this region, the spreading of the depletion layer is prevented. Accordingly, the destruction of the gate caused by the application of a high voltage of static electricity or the like can be reduced. The junction area between the gate electrode 22 and the n-type semiconductor layer 20 is reduced, and a leakage current flowing through the gate electrode 22 can be reduced.

Third Embodiment

Figure 7:
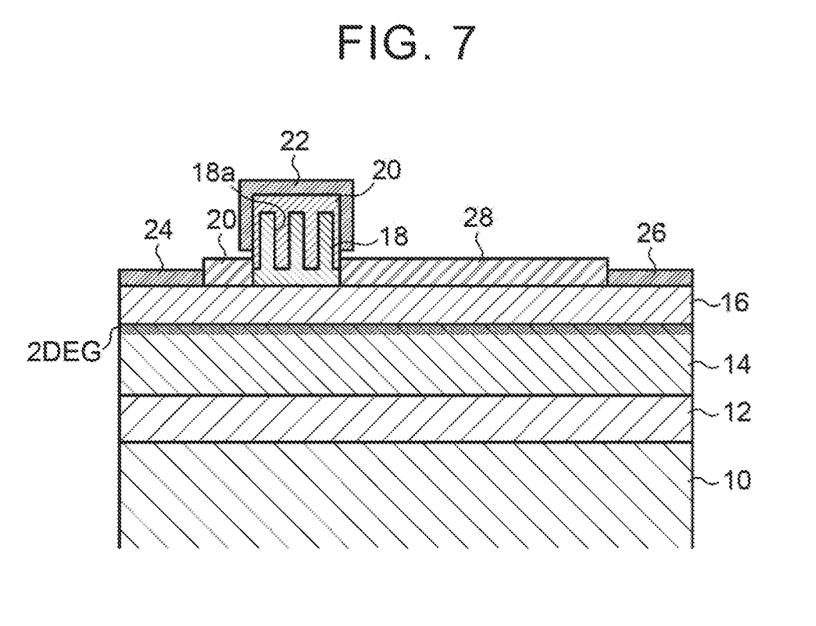
FIG. 7 is a sectional view schematically showing a configuration of a hetero-junction semiconductor device according to a third embodiment.

In a hetero-junction semiconductor device according to a third embodiment, as shown in FIG. 7, the gate electrode 22 is provided on a top surface and a side surface of the n-type semiconductor layer 20 of the hetero-junction semiconductor device according to the first embodiment. Configurations other than the formation region of the gate electrode 22 are the same as those of the hetero-junction semiconductor device according to the first embodiment. Therefore, the components are represented by the same reference numerals as in the first embodiment, and the description thereof will not be repeated.

Figure 8:
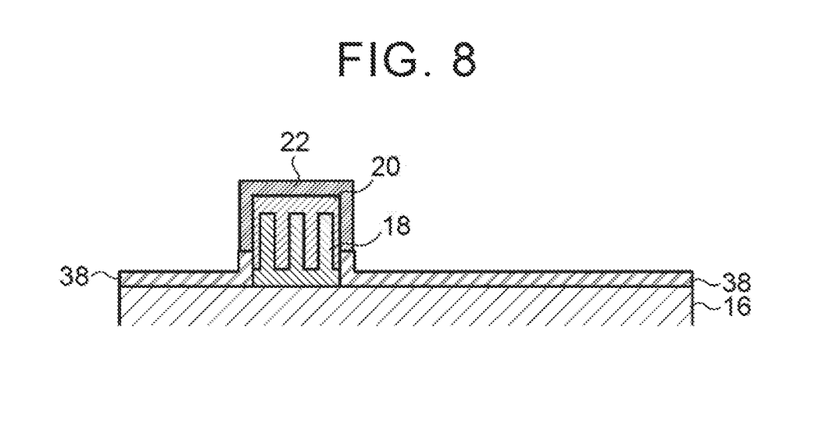
FIG. 8 is a diagram showing a method of manufacturing the hetero-junction semiconductor device according to the third embodiment.

As shown in FIG. 8, the gate electrode 22 can be formed using a method including: forming the resist 38 as an opening in a partial region of the top surface and the side surface of the n-type semiconductor layer 20 in Step S22; and forming the gate electrode 22 through the resist 38 as a mask by sputtering or vacuum vapor deposition using metal, a metal silicide, or an alloy thereof. At this time, in order to form the gate electrode 22 having a sufficient thickness on the side surface of the n-type semiconductor layer 20, it is preferable that sputtering or vacuum vapor deposition can be applied while rotating the substrate 10 in a state of being inclined with respect to a target or a vapor deposition source.

In the hetero-junction semiconductor device according to the third embodiment, the gate electrode 22 is provided on up to the side surface of the n-type semiconductor layer 20, and thus the junction area between the gate electrode 22 and the n-type semiconductor layer 20 can be widened. Accordingly, heat dissipation in the gate electrode 22 is improved. As a result, even in a case where a high voltage of static electricity or the like is applied to the gate electrode 22 and a high current flows through the gate electrode 22, the destruction of the device caused by the melting of the gate electrode 22 or the like can be suppressed.

Fourth Embodiment

Figure 9:
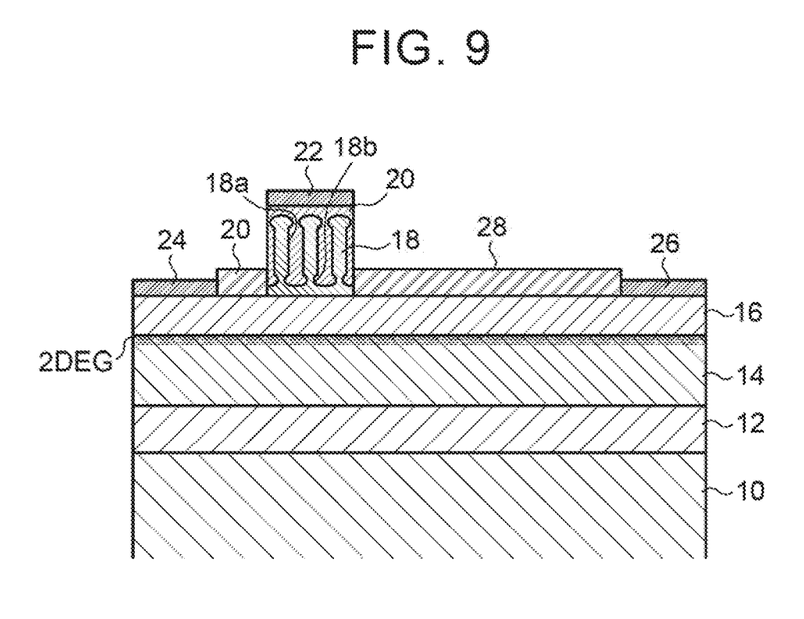
FIG. 9 is a sectional view schematically showing a configuration of a hetero-junction semiconductor device according to a fourth embodiment.

In a hetero-junction semiconductor device according to a fourth embodiment, as shown in FIG. 9, a corner 18b of the trench structure of the p-type semiconductor layer 18 has a curved surface. Configurations other than the shape of the p-type semiconductor layer 18 are the same as those of the hetero-junction semiconductor device according to the first embodiment. Therefore, the components are represented by the same reference numerals as in the first embodiment, and the description thereof will not be repeated.

Figure 10:
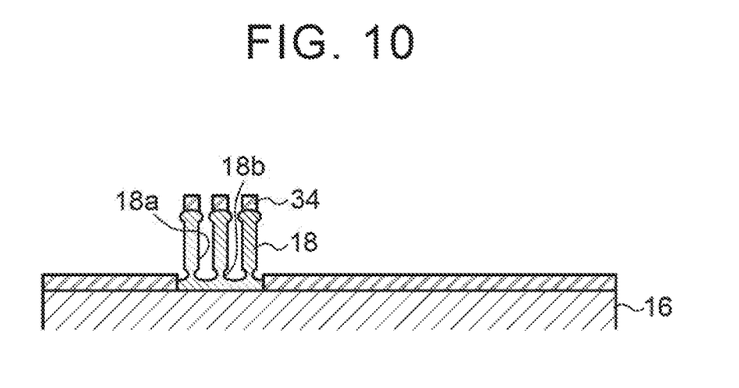
FIG. 10 is a diagram showing a method of manufacturing the hetero-junction semiconductor device according to the fourth embodiment.

As shown in FIG. 10, in the p-type semiconductor layer 18, the corner 18b of the trench structure can be processed to be a curved surface using a method including: forming the groove 18a of the trench structure in Step S16 of forming the trench structure; and isotropically etching the groove 18a.

In the hetero-junction semiconductor device according to the fourth embodiment, when a voltage is applied to the gate electrode 22, an electric field is not concentrated on the corner 18b of the trench structure of the p-type semiconductor layer 18. In addition, in a case where a high voltage is applied to the gate electrode 22, the destruction of the gate can be suppressed.

An appropriate combination of the configurations of the hetero-junction semiconductor devices according to the first to fourth embodiments may be applied.

The applicable range of the embodiments of the invention is not limited to a hetero-junction field effect transistor (HJFET). The embodiments can be applied to any hetero-junction semiconductor devices in which a current is controlled by a gate.

What is claimed is:

1. A hetero-junction semiconductor device comprising:
   a channel layer that includes a first semiconductor;
   a barrier layer that is provided on the channel layer and includes a semiconductor having a band gap larger than a band gap of the first semiconductor;
   a source electrode and a drain electrode that are provided on the barrier layer and are ohmic contacted to the barrier layer;
   a p-type semiconductor layer provided on the barrier layer, the p-type semiconductor layer being provided in a region between the source electrode and the drain electrode on the barrier layer;
   an n-type semiconductor layer that is provided on the p-type semiconductor layer; and
   a gate electrode that is joined to the n-type semiconductor layer, wherein
   a joint interface between the p-type semiconductor layer and the n-type semiconductor layer has a concavo-convex structure.

2. The hetero-junction semiconductor device according to claim 1, wherein
   in a convex region of the p-type semiconductor layer of the concavo-convex structure, the p-type semiconductor layer and the gate electrode are joined to each other through an insulating layer.

3. The hetero-junction semiconductor device according to claim 1, wherein
   the gate electrode is provided on a top surface of the n-type semiconductor layer and a side surface of the n-type semiconductor layer.

4. The hetero-junction semiconductor device according to claim 1, wherein
   a corner of the concavo-convex structure has a curved surface.

5. The hetero-junction semiconductor device according to claim 1, wherein
   the channel layer is composed of GaN,
   the barrier layer is composed of AlGaN,
   the p-type semiconductor layer is composed of p-type GaN, and
   the n-type semiconductor layer is composed of n-type GaN.

6. The hetero-junction semiconductor device according to claim 1, wherein
   a width of a groove in the concavo-convex structure is set such that a depletion layer spreads over an entire convex region of the p-type semiconductor layer and an entire convex region of the n-type semiconductor layer.

* * * * *